(12) United States Patent
Han et al.

(10) Patent No.: US 7,485,543 B2
(45) Date of Patent: Feb. 3, 2009

(54) METHOD FOR MANUFACTURING SEMICONDUCTOR DEVICE WITH OVERLAY VERNIER

(75) Inventors: Sang Jun Han, Gyeonggi-do (KR); Myung Goon Gil, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 217 days.

(21) Appl. No.: 11/642,598

(22) Filed: Dec. 21, 2006

(65) Prior Publication Data

US 2007/0155126 A1   Jul. 5, 2007

(30) Foreign Application Priority Data

Dec. 30, 2005   (KR) .................... 10-2005-0135239
Jun. 27, 2006   (KR) .................... 10-2006-0057945

(51) Int. Cl.
*H01L 21/76* (2006.01)
(52) U.S. Cl. ............... 438/424; 438/462; 257/E21.546
(58) Field of Classification Search ................ 438/424, 438/462; 257/E21.546
See application file for complete search history.

(56) References Cited

U.S. PATENT DOCUMENTS

2006/0057815 A1* 3/2006 Kim ........................... 438/401
2006/0148275 A1* 7/2006 Han et al. .................... 438/800

FOREIGN PATENT DOCUMENTS

| JP | 60229334 | 11/1985 |
| KR | 100170734 B1 | 10/1998 |
| KR | 1020020043779 A | 6/2002 |
| KR | 1020040057634 A | 7/2004 |

\* cited by examiner

*Primary Examiner*—Bradley K Smith
(74) *Attorney, Agent, or Firm*—Townsend and Townsend and Crew LLP

(57) ABSTRACT

A method for manufacturing a semiconductor device comprising dishing a part of a center of an isolation oxide film to form an overlay vernier having a step difference, prevents an attack in a CMP process of a gate polysilicon layer and improves an overlay characteristic due to the right-and-left symmetrical structure of the overlay vernier.

12 Claims, 10 Drawing Sheets

US 7,485,543 B2

METHOD FOR MANUFACTURING SEMICONDUCTOR DEVICE WITH OVERLAY VERNIER

CROSS-REFERENCES TO RELATED APPLICATIONS

The present application claims priority to Korean patent application numbers 10-2005-0135239 and 10-2006-0057945, filed on Dec. 30, 2005 and Jun. 27, 2006, which are incorporated by reference in their entireties.

BACKGROUND OF THE INVENTION

The present invention generally relates to a method for manufacturing a semiconductor device, and more specifically, to a technology of dishing a part of a center of an isolation oxide film to form an overlay vernier having a step difference. The present invention thereby prevents an attack in a CMP process of a gate polysilicon layer and improves an overlay characteristic resulting from the right-and-left symmetrical structure of the overlay vernier.

BRIEF SUMMARY OF THE INVENTION

Various embodiments of the present invention are directed at providing a method for manufacturing a semiconductor device which includes dishing a part of a center of an isolation oxide film by using an etching selectivity difference between a silicon substrate and an oxide film to form an overlay vernier having a step difference. This thereby prevents an attack in a CMP process of a gate polysilicon layer and improves an overlay characteristic due to the right-and-left symmetrical structure of the overlay vernier.

According to an embodiment of the present invention, a method for forming an overlay vernier for a semiconductor device comprising the steps of: forming a trench in a semiconductor substrate on a scribe lane using a first exposure mask; forming an isolation oxide film filling the trench; performing a CMP process onto the resultant to form an oxide pattern recessed into the trench; forming a hard mask layer over the resulting structure, the hard mask layer including a recessed region on the oxide pattern; selectively etching the hard mask layer and the isolation oxide pattern at a given depth using a second exposure mask opening the recessed region of the hard mask layer to form an overlay vernier; and removing the remaining hard mask layer.

According to an embodiment of the present invention, a method for forming an overlay vernier for device comprising the steps of: Forming a trench in a semiconductor substrate on a scribe lane using a first exposure mask; forming an isolation oxide film filling the trench; performing a CMP process onto the resultant to form an oxide pattern recessed into the trench; forming a hard mask layer over the resulting structure, the hard mask layer including a recessed region on the oxide pattern; selectivity etching the semiconductor substrate and the hard mask layer of the cell region at a given depth using a second exposure mask to form a recess gate region, and etching the hard mask layer of the scribe lane and the isolation oxide pattern opening the recessed region to form an overlay vernier; and removing the remaining hard mask layer.

DESCRIPTION OF EMBODIMENTS

The present invention will be described in detail with reference to the accompanying drawings.

FIGS. 1a through 1e are cross-sectional diagrams illustrating a conventional method for manufacturing a semiconductor device.

Figure 1A:
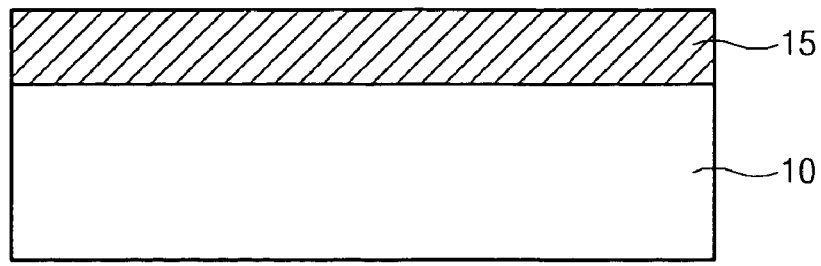
FIGS. 1a through 1e are cross-sectional diagrams illustrating a conventional method for manufacturing a semiconductor device.
Figure 1B:
Figure 1C:
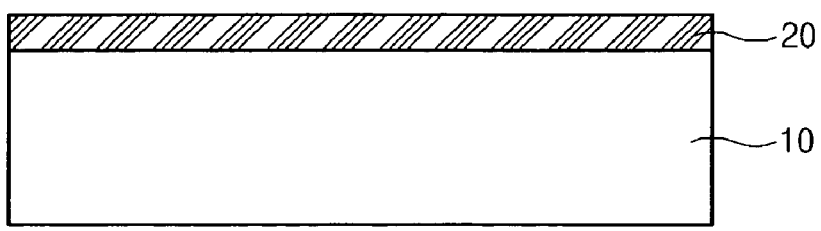
Figure 1D:
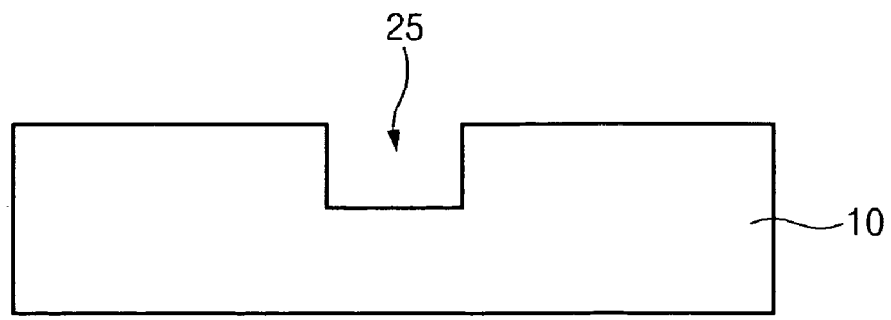
Figure 1E:
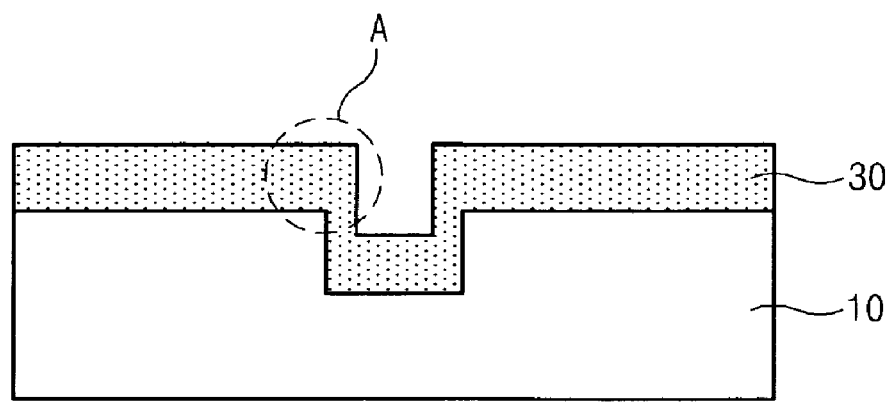
Figure 2A:
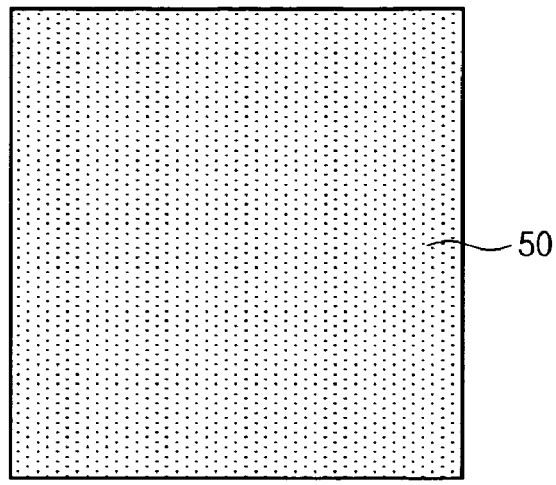
FIGS. 2a and 2b are plane diagrams a conventional exposure mask used when an overlay vernier of a semiconductor device is formed.

An isolation oxide film 15 is formed over a semiconductor substrate 10 with an isolation mask (see FIG. 2a).

A CMP process is performed to remove the isolation oxide film 15 of the scribe lane. Then, a hard mask layer 20 is formed over the semiconductor substrate 10.

Figure 2B:
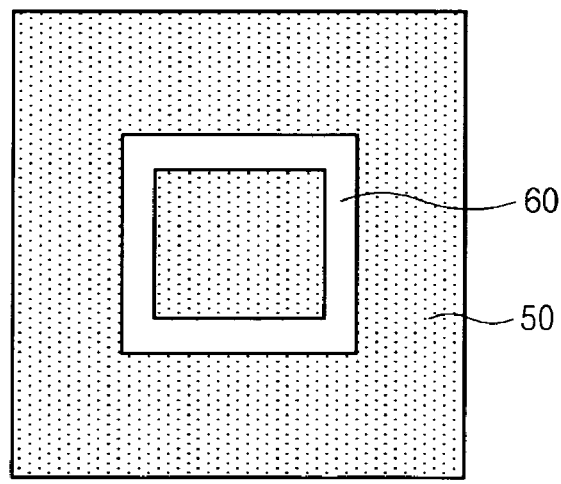
Figure 3A:
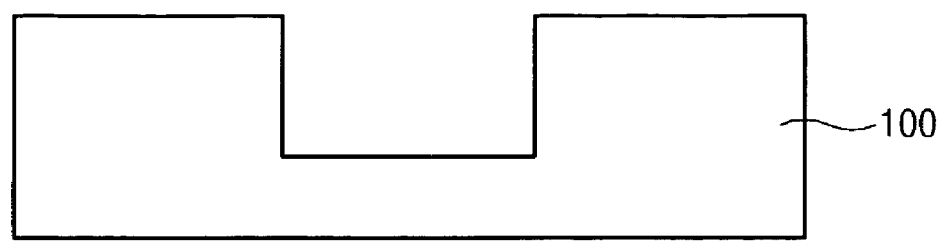
FIGS. 3a through 3f are cross-sectional diagrams illustrating a method for manufacturing a semiconductor device according to an embodiment of the present invention.
Figure 3B:
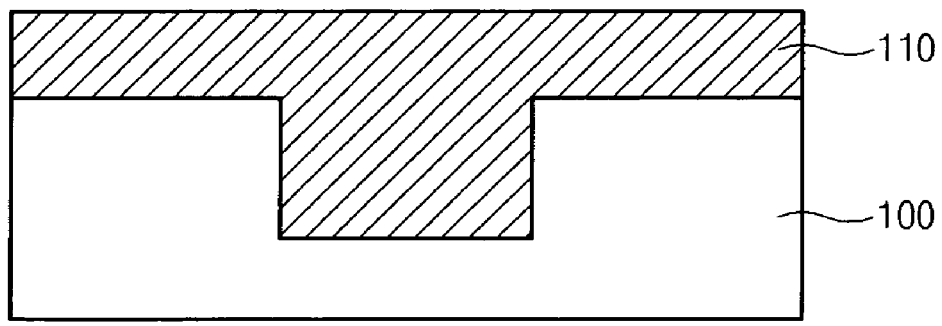
Figure 3C:
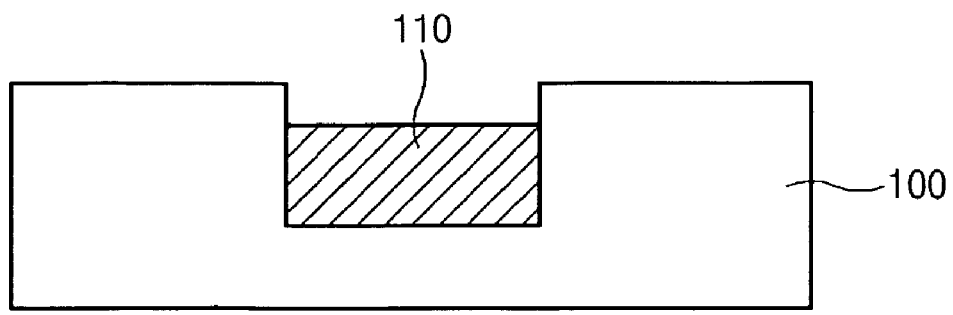
Figure 3D:
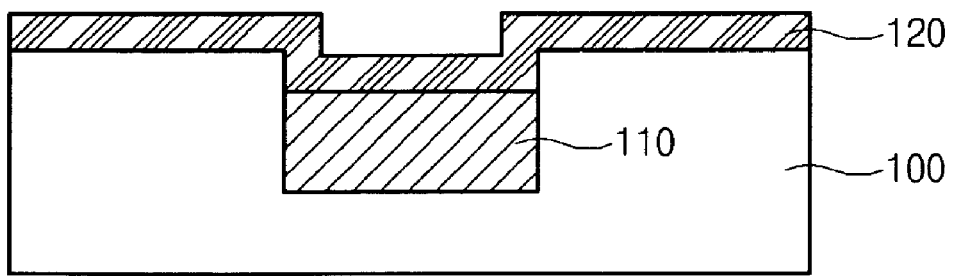
Figure 3E:
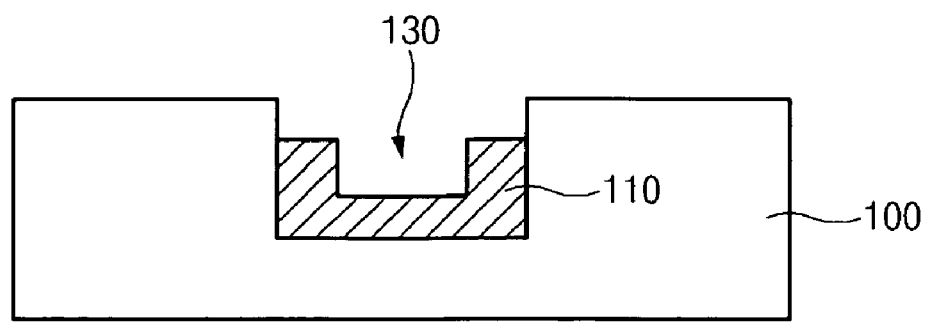
Figure 3F:
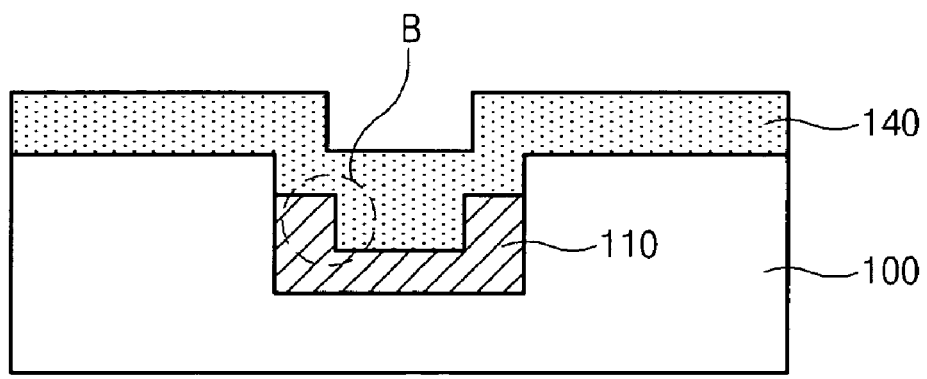

A photoresist film 50 is formed over the hard mask layer 20. An exposure and developing process is performed with a mask for overlay vernier (see FIG. 2b) to form a photoresist pattern 60. A photoresist pattern (not shown) is formed with the photoresist pattern (not shown) as a mask. The hard mask layer 20 is etched using the photoresist pattern (not shown) as a mask to form a hard mask pattern (not shown). The semiconductor substrate 10 is etched at a given depth using the hard mask pattern (not shown) as a mask to form an overlay vernier 25 having a step difference.

A gate oxide film (not shown) and a gate polysilicon layer 30 are formed over the semiconductor substrate 10 including the overlay vernier, and a CMP process is performed. As shown in 'A', the overlay vernier is formed to have the same height as that of the semiconductor substrate or a higher height than that of the semiconductor substrate so that the overlay vernier has an asymmetrical structure due to attack of the CMP process.

In the above-described conventional method, after the gate polysilicon layer 30 is formed, the step difference of the overlay vernier is formed to be asymmetric right-and-left resulting from different rotation direction and uniformity in the CMP process. This thereby degrades overlay characteristics and reduces yield.

FIGS. 3a through 3f are cross-sectional diagrams illustrating a method for manufacturing a semiconductor device according to an embodiment of the present invention.

Figure 4A:
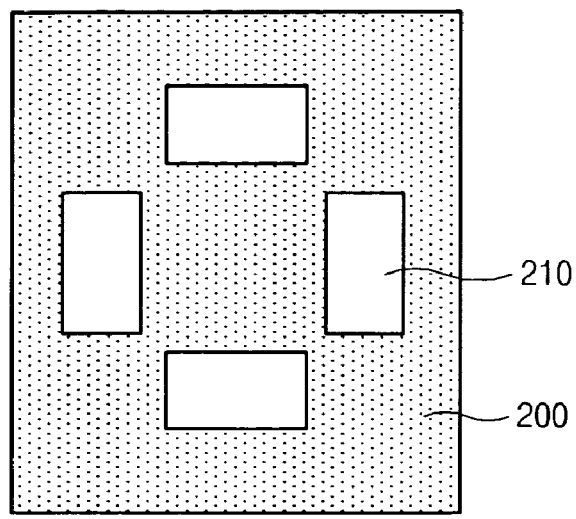
FIGS. 4a through 4e are plane diagrams illustrating a first exposure mask used when an overlay vernier of a semiconductor device is formed according to an embodiment of the present invention.
Figure 4B:
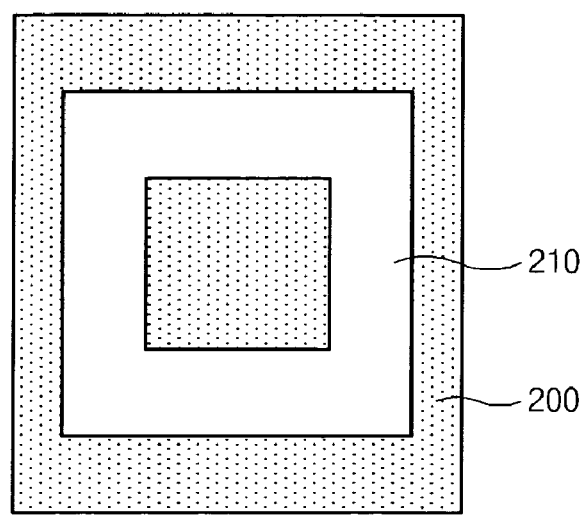
Figure 4C:
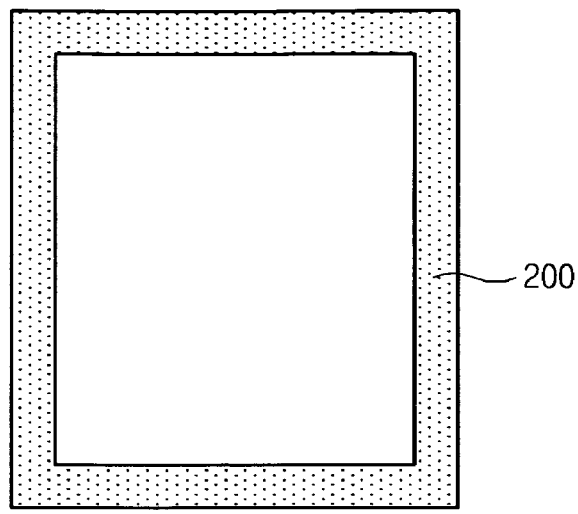
Figure 4D:
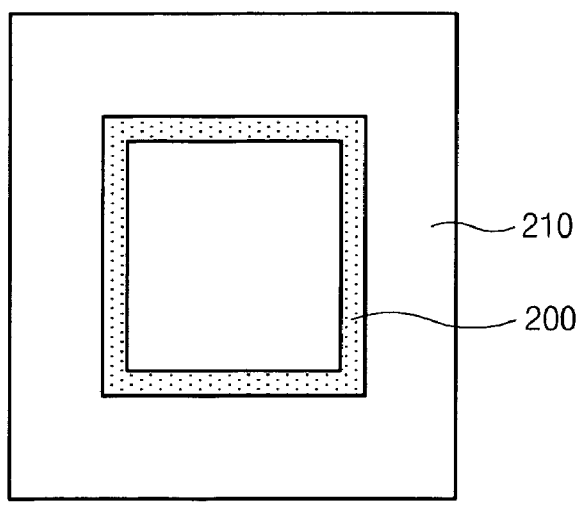
Figure 4E:
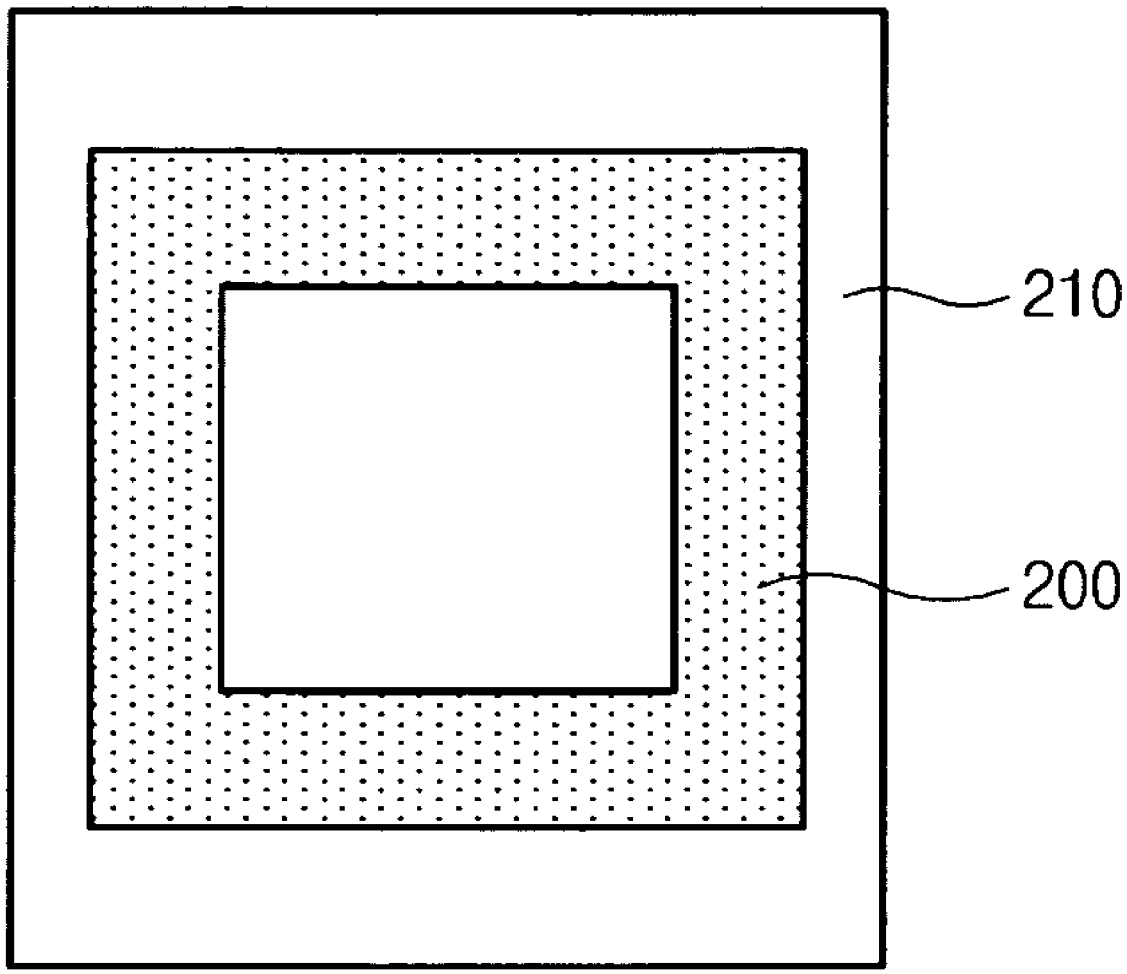

A first photoresist film 140 is formed over a semiconductor substrate 100. An exposure and developing process is performed with an isolation mask (see FIGS. 4a through 4e) which is a first exposure mask to form a first photoresist pattern. The semiconductor substrate is etched at a given depth with the first photoresist pattern as a mask to form a trench 130. The first exposure mask is selected from the group consisting of a first type (see FIG. 4a) in which four bar-type transparent patterns 210 are formed on four rectangular corners, respectively, a second type (see FIG. 4b) a transparent pattern in form of a rectangular stripe, a third type (see FIG. 4c) of a transparent pattern in form of a tetragon, rectangular floodlight pattern 210, and a fourth type (see FIGS. 4d and 4e) of an opaque pattern in form of a rectangular stripe.

An isolation oxide film 110 filling the trench is formed.

A CMP process is performed onto the resultant to form an oxide film 110 recessed into the trench. A step difference is formed while the oxide film 110 is relatively polished faster than the semiconductor substrate 100 by an etching selectivity difference of the semiconductor substrate 100 and the oxide film 110.

A hard mask layer 120 is formed over the semiconductor substrate 100 the hard mask layer including a recessed region on the oxide pattern 130.

Figure 5A:
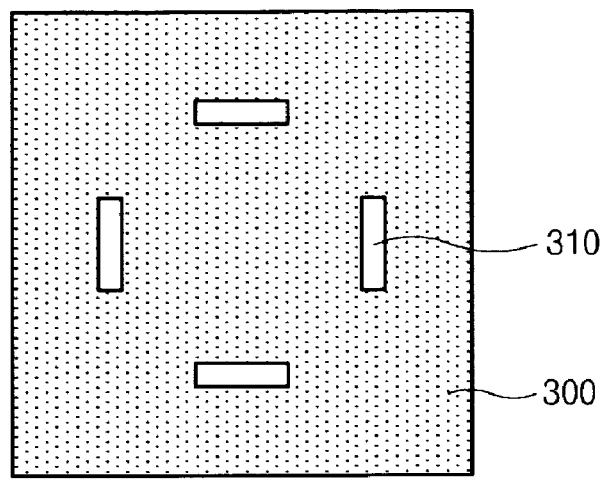
FIGS. 5a and 5b are plane diagrams illustrating a second exposure mask used when an overlay vernier of a semiconductor device is formed according to an embodiment of the present invention.
Figure 5B:
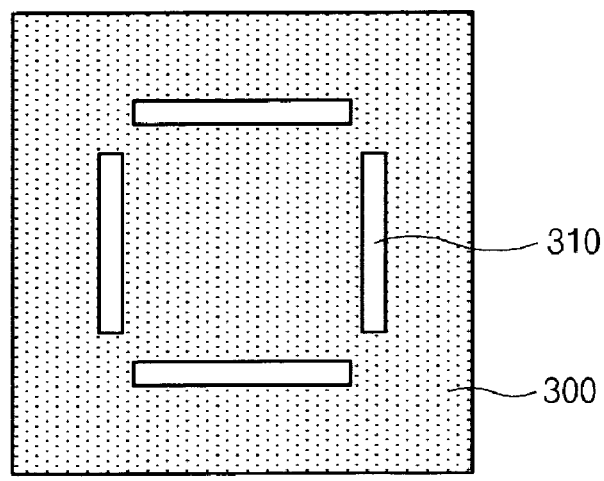

An exposure and developing process is performed with a mask for overlay vernier (see FIGS. 5a and 5b) which is a second exposure mask to form a second photoresist pattern (not shown). The hard mask layer 120 and the isolation oxide film 110 are etched at a given depth using the second photoresist pattern (not shown) to form an overlay vernier. The second exposure mask is 4 bar-type transparent patterns 310 which are formed on four rectangular corners, respectively (see FIGS. 5a and 5b). Then, the remaining hard mask layer 120 is removed.

A gate polysilicon layer 140 is formed over the semiconductor substrate 100 including the overlay vernier, and a CMP process is performed. As shown in 'B', the overlay vernier is located to have the step difference under the semiconductor substrate 100 to prevent attack in the CMP process.

As described above, according to an embodiment of the present invention, a method for manufacturing a semiconductor device includes dishing a part of a center of an isolation oxide film to form an overlay vernier having a step difference, thereby preventing attack in a CMP process of a gate polysilicon layer and improving an overlay characteristic due to the right-and-left symmetrical structure of the overlay vernier.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming an overlay vernier for a semiconductor device comprising the steps of:
    forming a trench in a semiconductor substrate on a scribe lane using a first exposure mask;
    forming an isolation oxide film filling the trench;
    performing a CMP process onto the resultant to form an oxide pattern recessed into the trench;
    forming a hard mask layer over the resulting structure, the hard mask layer including a recessed region on the oxide pattern;
    selectively etching the hard mask layer and the isolation oxide pattern at a given depth using a second exposure mask opening the recessed region of the hard mask layer to form an overlay vernier; and
    removing the remaining hard mask layer.

2. The method according to claim 1, wherein the CMP process is performed by polishing the oxide film faster than the semiconductor substrate by using an etching selectivity difference between the semiconductor substrate and the oxide film.

3. The method according to claim 1, wherein the CMP process is performed by polishing the oxide film at a rate greater than that for polishing the semiconductor substrate by using an etching selectivity difference between the semiconductor substrate and the oxide film.

4. The method according to claim 1, further comprising forming a gate polysilicon layer over the resultant obtained after the remaining-hard-mask-layer-removing step; and
    performing CMP process onto the resultant.

5. The method according to claim 1, wherein the first exposure mask is selected from the group consisting of:
    a first type in which four bar-type transparent patterns are formed on four rectangular corners, respectively;
    a second type of transparent pattern in form of a rectangular stripe;
    a third type of transparent pattern in form of a tetragon; and
    a fourth type of an opaque pattern in form of a rectangular stripe.

6. The method according to claim 1, wherein the second exposure mask includes four bar-type transparent patterns are formed on four rectangular corners, respectively.

7. A method for manufacturing a semiconductor device including a main scale having a step difference, the method comprising the steps of:
    forming a trench in a semiconductor substrate on a scribe lane using a first exposure mask;
    forming an isolation oxide film filling the trench;
    performing a CMP process onto the resultant to form an oxide pattern recessed into the trench;
    forming a hard mask layer over the resulting structure, the hard mask layer including a recessed region on the oxide pattern;
    selectivity etching the semiconductor substrate and the hard mask layer of the cell region at a given depth using a second exposure mask to form a recess gate region, and etching the hard mask layer of the scribe lane and the isolation oxide pattern opening the recessed region to form an overlay vernier; and
    removing the remaining hard mask layer.

8. The method according to claim 7, wherein the CMP process is performed by polishing the oxide film faster than the semiconductor substrate by using an etching selectivity difference between the semiconductor substrate and the oxide film.

9. The method according to claim 7, wherein the CMP process is performed by polishing the oxide film at a rate greater than the rate of polishing the semiconductor substrate by using an etching selectivity difference between the semiconductor substrate and the oxide film.

10. The method according to claim 7, further comprising forming a gate polysilicon layer over the resultant obtained after the remaining-hard-mask-layer-removing step; and
    performing CMP process onto the resultant.

11. The method according to claim 7, wherein the first exposure mask is selected from the group consisting of:
    a first type in which four bar-type transparent patterns are formed on four rectangular corners, respectively;
    a second type of transparent pattern in form of a rectangular stripe;
    a third type of transparent pattern in form of a tetragon; and
    a fourth type of an opaque pattern in form of a rectangular stripe.

12. The method according to claim 7, wherein the second exposure mask includes four bar-type transparent patterns are formed on four rectangular corners, respectively.

* * * * *